(12) United States Patent
Huang

(10) Patent No.: US 11,501,932 B2
(45) Date of Patent: Nov. 15, 2022

(54) ILLUMINATED KEYPAD MODULE FOR AN ELECTRIC LOCK

(71) Applicant: Taiwan Fu Hsing Industrial Co., Ltd., Kaohsiung (TW)

(72) Inventor: Fu-Chih Huang, Kaohsiung (TW)

(73) Assignee: Taiwan Fu Hsing Industrial Co., Ltd., Kaohsiung (TW)

( * ) Notice: Subject to any disclaimer, the term of this patent is extended or adjusted under 35 U.S.C. 154(b) by 463 days.

(21) Appl. No.: 16/697,622

(22) Filed: Nov. 27, 2019

(65) Prior Publication Data
US 2020/0402741 A1 Dec. 24, 2020

(30) Foreign Application Priority Data

Jun. 19, 2019 (TW) ................................. 108207810

(51) Int. Cl.
| | | |
|---|---|---|
| *H01H 13/705* | (2006.01) | |
| *E05B 47/00* | (2006.01) | |
| *H01H 13/86* | (2006.01) | |
| *H05K 1/18* | (2006.01) | |
| *H01H 13/78* | (2006.01) | |
| *H01H 13/83* | (2006.01) | |
| *E05B 17/10* | (2006.01) | |
| *H01H 13/703* | (2006.01) | |

(52) U.S. Cl.
CPC .......... *H01H 13/705* (2013.01); *E05B 17/10* (2013.01); *E05B 47/0001* (2013.01); *H01H 13/703* (2013.01); *H01H 13/78* (2013.01); *H01H 13/83* (2013.01); *H01H 13/86* (2013.01); *H05K 1/18* (2013.01); *H01H 2211/018* (2013.01); *H01H 2239/064* (2013.01); *H05K 2201/10053* (2013.01); *H05K 2201/10121* (2013.01)

(58) Field of Classification Search
CPC ... E05B 17/10; E05B 47/0001; H01H 13/703; H01H 13/705; H01H 13/78; H01H 13/83; H01H 13/86; H01H 2211/018; H01H 2239/064; H05K 1/18; H05K 2201/10053; G07C 9/00674
See application file for complete search history.

(56) References Cited

U.S. PATENT DOCUMENTS 3,699,294 A * 10/1972 Sudduth ................. H01H 1/029
                                                            264/105
9,758,991 B2 * 9/2017 Lin ..................... G07C 9/00944

* cited by examiner

*Primary Examiner* — Vanessa Girardi
(74) *Attorney, Agent, or Firm* — Alan D. Kamrath; Karin L. Williams; Mayer & Williams PC

(57) ABSTRACT

An electric lock includes a housing, a keypad module and a lock assembly. The keypad module is arranged on the housing. The keypad module includes a key panel, an electrode pad, a circuit board and a spacer. The key panel is marked with a plurality of key characters. The electrode pad is arranged on an inner side of the key panel, and the electrode pad has a plurality of key electrodes corresponding to the plurality of key characters respectively. The circuit board includes a plurality of key circuits. Each of the key circuits is configured to generate a key signal when contacting a corresponding key electrode. The spacer is configured to form a gap between each of the key circuits and the corresponding key electrode. The lock assembly is electrically connected to the keypad module for performing locking and unlocking operations according to the key signal.

12 Claims, 4 Drawing Sheets

ILLUMINATED KEYPAD MODULE FOR AN ELECTRIC LOCK

BACKGROUND OF THE INVENTION

1. Field of the Invention

The present invention relates to an electric lock, and more particularly, to an electric lock having an improved keypad structure.

2. Description of the Prior Art

An electric lock usually has a keypad configured to receive user input for performing an unlocking or locking operation. Generally, the keypad of the electric lock can be a touch keypad or a push-button keypad. The touch keypad is configured to receive touch input of a user, and the push-button keypad is configured to receive press input of the user. In contrast to a flat appearance of the touch keypad, the push-button keypad has a plurality of protruded keys to be pressed by the user. In the prior art, the push-button keypad cannot have the flat appearance of the touch keypad due to structural limitations, such that the appearance design of the electric lock is limited.

SUMMARY OF THE INVENTION

The present invention provides an electronic lock and a keypad module thereof.

The electronic lock of the present invention comprises a housing, a keypad module and a lock assembly. The keypad module is arranged on the housing. The keypad module comprises a key panel, an electrode pad, a circuit board and a spacer. The key panel is marked with a plurality of key characters. The electrode pad is arranged on an inner side of the key panel. The electrode pad has a plurality of key electrodes corresponding to the plurality of key characters respectively. The circuit board comprises a plurality of key circuits corresponding to the plurality of key electrodes respectively. Each of the key circuits is configured to generate a key signal when contacting a corresponding key electrode. The spacer is arranged between the electrode pad and the circuit board and configured to form a gap between each of the key circuits and the corresponding key electrode. The lock assembly electrically connected to the keypad module and configured to perform locking and unlocking operations according to the key signal generated by the keypad module.

The keypad module of the electric lock of the present invention comprises a key panel, an electrode pad, a circuit board and a spacer. The key panel is marked with a plurality of key characters. The electrode pad is arranged on an inner side of the key panel. The electrode pad has a plurality of key electrodes corresponding to the plurality of key characters respectively. The circuit board comprises a plurality of key circuits corresponding to the plurality of key electrodes respectively. Each of the key circuits is configured to generate a key signal when contacting a corresponding key electrode. The spacer is arranged between the electrode pad and the circuit board and configured to form a gap between each of the key circuits and the corresponding key electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
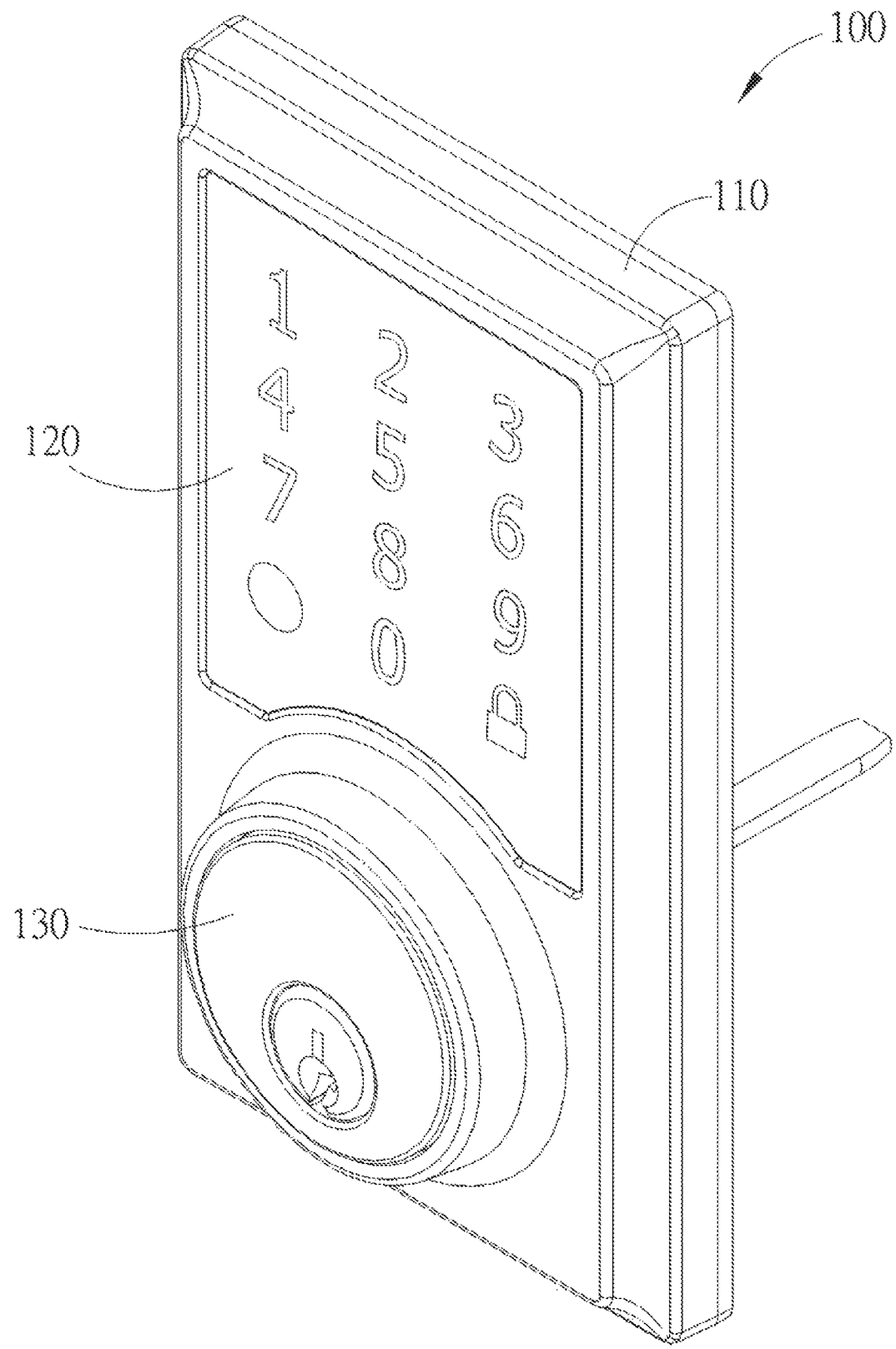
FIG. 1 is a diagram showing an electric lock of the present invention.
Figure 2:
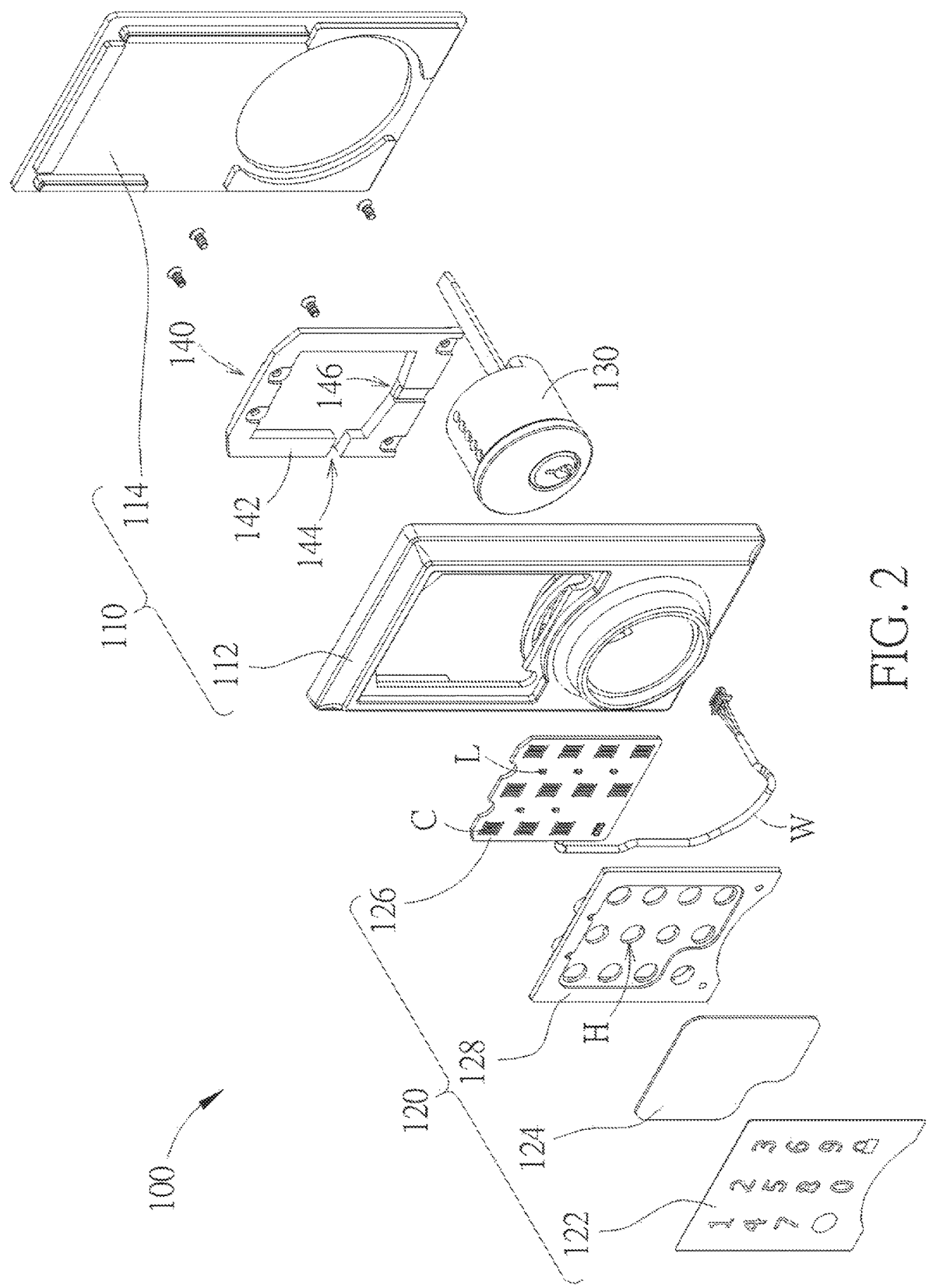
FIG. 2 is an exploded view of the electric lock of the present invention.
Figure 3:
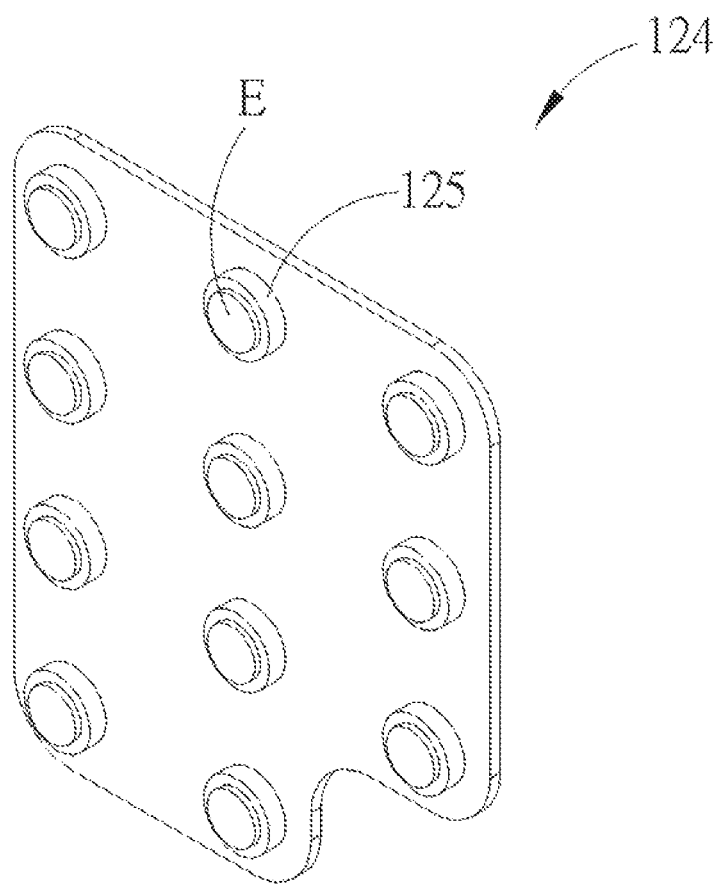
FIG. 3 is a diagram showing an electrode pad of the electric lock of the present invention.

Please refer to FIG. 1 to FIG. 3. FIG. 1 is a diagram showing an electric lock of the present invention, FIG. 2 is an exploded view of the electric lock of the present invention, and FIG. 3 is a diagram showing an electrode pad of the electric lock of the present invention. As shown in figures, the electric lock 100 of the present invention comprises a housing 110, a keypad module 120 and a lock assembly 130. The housing 110 comprises a decorative frame 112 and a rear cover 114. The rear cover 114 can be a waterproof gasket. The keypad module 120 is arranged on the housing 110, such as fixed to the decorative frame 112. The keypad module 120 comprises a key panel 122, an electrode pad 124, a circuit board 126 and a spacer 128. The key panel 122 is marked with a plurality of key characters. The plurality of key characters can be printed Arabic numerals and graphic symbols, but the present invention is not limited thereto. The electrode pad 124 is arranged on an inner side of the key panel 122, and a surface of the electrode pad 124 facing the circuit board 126 is formed with a plurality of protruded structures 125. Each of the protruded structures 125 is arranged with a key electrode E. The key electrodes E on the electrode pad 124 respectively correspond to the key characters on the key panel 122. The circuit board 126 is arranged with a plurality of key circuits C corresponding to the plurality of key electrodes E on the electrode pad 124 respectively. Each of the key circuits C is configured to generate a key signal when contacting the corresponding key electrode E. The spacer 128 is arranged between the electrode pad 124 and the circuit board 126 in order to space the electrode pad 124 and the circuit board 126 apart, such that the key electrode E can be prevented from contacting the key circuit C when the key panel 122 is not pressed. The spacer 128 is made of a hard and opaque material. The spacer 128 is formed with a plurality of through holes H for allowing the plurality of protruded structures 125 of the electrode pad 124 to pass through. The lock assembly 130 is electrically connected to the circuit board 126 of the keypad module 120 and configured to perform locking and unlocking operations according to the key signal generated by the keypad module 120. For example, the lock assembly 130 can comprise a motor and a clutch mechanism (not shown in figures). When the key signal generated by the keypad module 120 corresponds to or matches an authentication data pre-stored in the lock assembly 130, the lock assembly 130 is configured to perform the unlocking operation (such as activating the motor to drive the clutch mechanism of the lock assembly 130 to engage with a latch assembly of the electric lock 100). On the other hand, when the key signal generated by the keypad module 120 corresponds to or matches a locking command, the lock assembly 130 is configured to perform the locking operation (such as activating the motor to drive the clutch mechanism of the lock assembly 130 to disengage from the latch assembly of the electric lock 100). In addition, the lock assembly 130 can further comprise a lock core (not shown in figures) configured to be driven by a key to further drive the latch assembly to move. Therefore, when the electric lock 100 of the present invention loses power, a user can still use the key to perform unlocking or locking operations.

Figure 4:
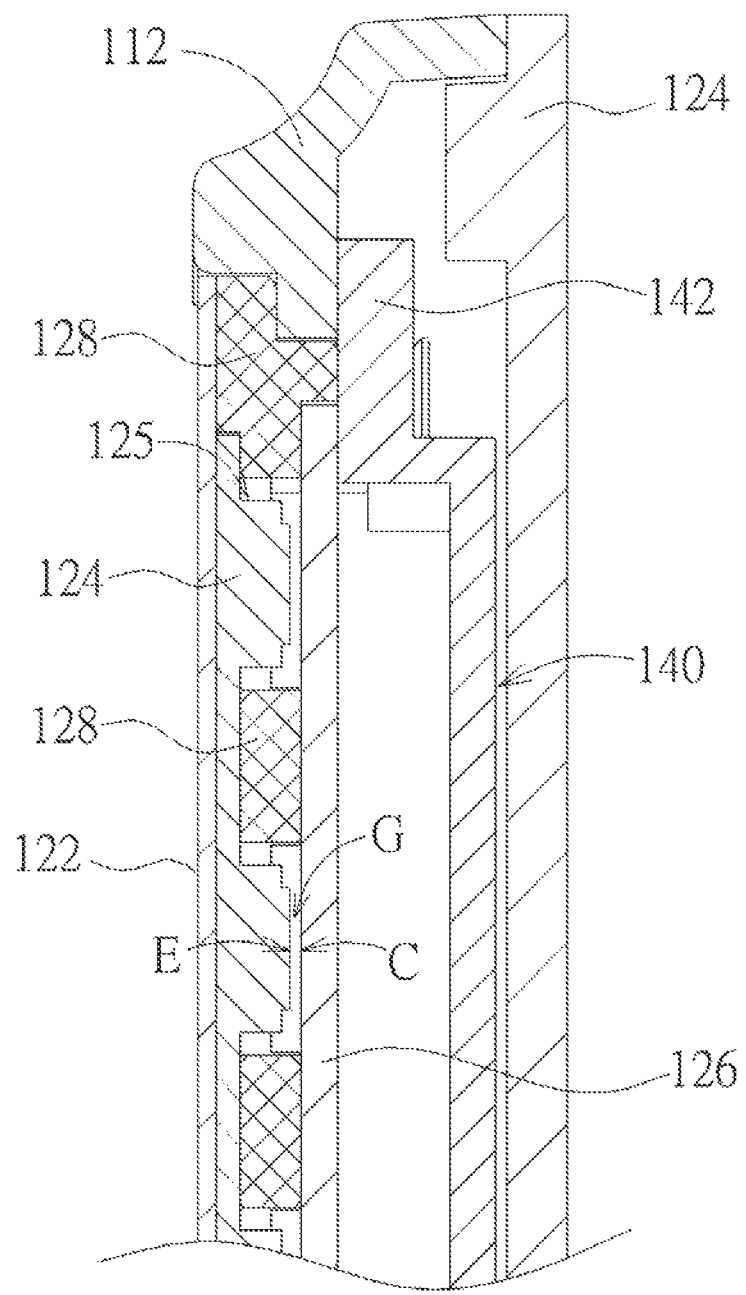
FIG. 4 is a partial cross-sectional view of the electric lock of the present invention.

Please refer to FIG. 4, and refer to FIG. 1 to FIG. 3 as well. FIG. 4 is a partial cross-sectional view of the electric lock of the present invention. As shown in FIG. 4, the spacer 128 is configured to space the electrode pad 124 and the circuit board 126 apart, so as to form a gap G between each of the key circuits C and the corresponding key electrode E. Therefore, the spacer 128 can prevent the key electrode E from contacting the key circuit C when the key panel 122 is not pressed. On the other hand, the electrode pad 124 can be made of a soft material (which is softer than the material of the key panel 122 and the material of the spacer 128), such as silicone, but the present invention is not limited thereto. When the user presses the key panel 122, a deformation level of the electrode pad 124 is greater than a deformation level of the key panel 122 (also greater than a deformation level of the spacer 128), such that the protruded structures 125 can be moved or extended toward the circuit board 126, to allow the key electrode E to contact the key circuit C to further generate a key signal.

According to the above arrangement, although the keypad module 120 of the electric lock 100 of the present invention is a push-button keypad, an outer side of the key panel 122 can be a flat surface. In other words, the keypad module 120 of the electric lock 100 of the present invention can have a flat appearance similar to a touch keypad (no protruded keys). Moreover, the gap G between the key circuit C and the key electrode E can be adjusted according to design requirements (such as changing a height of the protruded structure 125 or a thickness of the spacer 128). When the gap G between the key circuit C and the key electrode E is smaller, the user can press the key panel 122 with a smaller force and a shorter stroke to enable the keypad module 120 to generate the key signal. In other words, the gap G between the key circuit C and the key electrode E of the electric lock 100 of the present invention can be adjusted according to the design requirements, such that the user only needs to gently press the key panel 122 to enable the keypad module 120 to generate the key signal, thereby providing an input feeling similar to a touch keypad. Therefore, the keypad module 120 of the electric lock 100 of the present invention can have the flat appearance and input feeling similar to the touch keypad.

Please refer to FIG. 2 and FIG. 4. The electric lock 100 of the present invention can further comprise a fixing frame 140. The fixing frame 140 is configured to be connected to the spacer 128 (such as fixed to the spacer 128 by a screw). An outer edge 142 of the fixing frame 140 is configured to abut against the circuit board 126 to fix the circuit board 126 between the spacer 128 and the fixing frame 140, so as to prevent change of the gap G between the key circuit C and the key electrode E due to movement or deflection of the circuit board 126.

In addition, as shown in FIG. 2, the outer edge 142 of the fixing frame 140 can be formed with at least one groove or notch. In the present embodiment, the outer edge 142 of the fixing frame 140 is formed with a groove 144 and a groove 146. The groove 144 is formed on a lateral side of the fixing frame 140 for allowing a wire W of the circuit board 126 to pass through. The groove 146 is formed at a bottom of the fixing frame 140. The groove 146 can work as a water guiding groove for preventing the keypad module 120 from accumulating water which may cause damages on the circuit board 126 or electronic components of the electric lock 100.

On the other hand, the circuit board 126 can be arranged with light sources L, and the electrode pad 124 can be made of a light transmissive material. When the light sources L emit light, the protruded structures 125 of the electrode pad 124 can guide the light emitted from the light sources L to the key characters on the key panel 122 (the light not guided by the protruded structure 125 is blocked by the spacer 128), such that the key characters on the key panel 122 become more visible. Furthermore, the outer side of the key panel 122 can be formed with a plurality of bumps (not shown in figures) corresponding to the plurality of key characters respectively. The bumps can help the user to confirm positions of the key characters by sense of touch.

In contrast to the prior art, the keypad module of the electric lock of the present invention provides an improved push-button keypad structure. The keypad module of the electric lock of the present invention is not necessary to comprise protruded keys. Therefore, the keypad module of the electric lock of the present invention can have a flat appearance similar to a touch keypad. Moreover, the keypad module of the electric lock of the present invention can allow the user to press and input with the smaller force and the shorter stroke. Thus, the keypad module of the electric lock of the present invention can provide the input feeling similar to the touch keypad. The electric lock of the present invention greatly can increase design flexibility of the push-button keypad.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electric lock, comprising:
   a housing;
   a push-button keypad module arranged on the housing, the keypad module comprising:
      a key panel marked with a plurality of key characters and having an outer surface and an inner surface, wherein both the outer surface and the inner surface of the key panel are flat surfaces;
      an electrode pad arranged on an inner side of the key panel, the electrode pad having a first surface and a second surface opposite to the first surface, wherein the first surface is a flat surface contacting the flat inner surface of the key panel without forming with protrusions penetrating the key panel, the second surface is formed with a plurality of protruded structures, each of the protruded structures is arranged with a key electrode, the key electrodes correspond to the plurality of key characters respectively;
      a circuit board comprising a plurality of key circuits corresponding to the plurality of key electrodes respectively, each of the key circuits being configured to generate a key signal when contacting a corresponding key electrode; and
      a spacer arranged between the electrode pad and the circuit board and configured to form a gap between each of the key circuits and the corresponding key electrode; and
   a lock assembly electrically connected to the keypad module and configured to perform locking and unlocking operations according to the key signal generated by the keypad module;

wherein the protruded structures are protruded from the second surface of the electrode pad and extended toward the key circuits of the circuit board.

2. The electric lock of claim 1, wherein when the key panel is pressed, a deformation level of the electrode pad is greater than a deformation level of the key panel, and is greater than a deformation level of the spacer.

3. The electric lock of claim 1, wherein the spacer is made of a hard and opaque material, the spacer is formed with a plurality of through holes configured to allow the plurality of protruded structures of the electrode pad to pass through.

4. The electric lock of claim 1, wherein the circuit board is arranged with a light source, and the electrode pad is made of a light transmissive material and configured to guide light emitted from the light source to the key panel.

5. The electric lock of claim 1, further comprising a fixing frame connected to the spacer in order to fix the circuit board between the spacer and the fixing frame.

6. The electric lock of claim 5, wherein an outer edge of the fixing frame is configured to abut against the circuit board, and the outer edge of the fixing frame is formed with at least one groove or notch.

7. A push-button keypad module of an electric lock, comprising:
a key panel marked with a plurality of key characters and having an outer surface and an inner surface, wherein both the outer surface and the inner surface of the key panel are flat surfaces;
an electrode pad arranged on an inner side of the key panel, the electrode pad having a first surface and a second surface opposite to the first surface, wherein the first surface is a flat surface contacting the flat inner surface of the key panel without forming with protrusions penetrating the key panel, the second surface is formed with a plurality of protruded structures, each of the protruded structures is arranged with a plurality of key electrodes corresponding to the plurality of key characters respectively;
a circuit board comprising a plurality of key circuits corresponding to the plurality of key electrodes respectively, each of the key circuits being configured to generate a key signal when contacting a corresponding key electrode; and
a spacer arranged between the electrode pad and the circuit board and configured to form a gap between each of the key circuits and the corresponding key electrode;
wherein the protruded structures are protruded from the second surface of the electrode pad and extended toward the key circuits of the circuit board.

8. The keypad module of claim 7, wherein when the key panel is pressed, a deformation level of the electrode pad is greater than a deformation level of the key panel, and is greater than a deformation level of the spacer.

9. The keypad module of claim 7, wherein the spacer is made of a hard and opaque material, the spacer is formed with a plurality of through holes configured to allow the plurality of protruded structures of the electrode pad to pass through.

10. The keypad module of claim 7, wherein the circuit board is arranged with a light source, and the electrode pad is made of a light transmissive material and configured to guide light emitted from the light source to the key panel.

11. The keypad module of claim 7, further comprising a fixing frame connected to the spacer in order to fix the circuit board between the spacer and the fixing frame.

12. The keypad module of claim 11, wherein an outer edge of the fixing frame is configured to abut against the circuit board, and the outer edge of the fixing frame is formed with at least one groove or notch.

* * * * *